(12) United States Patent  
Robbins et al.

(10) Patent No.: US 11,127,636 B2  
(45) Date of Patent: *Sep. 21, 2021

(54) BOT GROUP MESSAGING USING BOT-SPECIFIC VOICE LIBRARIES

(71) Applicant: Orion Labs, San Francisco, CA (US)

(72) Inventors: Jesse Robbins, San Francisco, CA (US); Greg Albrecht, San Francisco, CA (US); Ellen Juhlin, San Francisco, CA (US)

(73) Assignee: Orion Labs, Inc., San Francisco, CA (US)

( * ) Notice: Subject to any disclaimer, the term of this patent is extended or adjusted under 35 U.S.C. 154(b) by 18 days.

This patent is subject to a terminal disclaimer.

(21) Appl. No.: 15/937,035

(22) Filed: Mar. 27, 2018

(65) Prior Publication Data

US 2018/0309805 A1 Oct. 25, 2018
US 2021/0075835 A9 Mar. 11, 2021

Related U.S. Application Data

(60) Provisional application No. 62/477,082, filed on Mar. 27, 2017.

(51) Int. Cl.
*G06F 15/16* (2006.01)
*H01L 21/8234* (2006.01)
(Continued)

(52) U.S. Cl.
CPC ...... *H01L 21/823418* (2013.01); *G10L 15/26* (2013.01); *H01L 21/02592* (2013.01);
(Continued)

(58) Field of Classification Search
CPC ..... H01L 21/823418; H01L 21/823814; H01L 27/1211; H01L 27/0924; H01L 29/785;
(Continued)

(56) References Cited

U.S. PATENT DOCUMENTS 7,072,941 B2 * 7/2006 Griffin ................ H04L 12/1827
709/204
9,325,511 B2 4/2016 Helbing et al.
(Continued)

OTHER PUBLICATIONS

International Search Report and Written Opinion dated Jun. 22, 2018 for PCT Application No. PCT/US2018/024529, 20 pages.

*Primary Examiner* — Vivek Srivastava
*Assistant Examiner* — Karina J Garcia-Ching

(57) ABSTRACT

A method includes receiving, by a group messaging service, a message including recorded audio and a first group identifier, and determining that the group includes a bot. The method also includes determining whether the bot is a user bot responsive to a user node in the group or a group bot responsive to each of the one or more user nodes, selecting a bot voice library to process the recorded audio, sending, by the group messaging service, the recorded audio to the determined user bot or group bot, processing the recorded audio to produce enhanced text, performing, by the determined user bot or group bot, one or more designated actions corresponding to one of the recorded audio and the enhanced text, and sending, by the determined user bot or group bot, an audio reply to the group messaging service.

20 Claims, 12 Drawing Sheets

(51) Int. Cl.
    *G10L 15/26*     (2006.01)
    *H01L 21/02*     (2006.01)
    *H01L 21/308*     (2006.01)
    *H01L 21/8238*     (2006.01)
    *H01L 21/84*     (2006.01)
    *H01L 27/092*     (2006.01)
    *H01L 27/12*     (2006.01)
    *H01L 29/66*     (2006.01)
    *H01L 29/78*     (2006.01)
    *H04L 12/58*     (2006.01)
    *H04L 29/06*     (2006.01)

(52) U.S. Cl.
    CPC ...... *H01L 21/02675* (2013.01); *H01L 21/308* (2013.01); *H01L 21/823431* (2013.01); *H01L 21/823814* (2013.01); *H01L 21/823821* (2013.01); *H01L 21/845* (2013.01); *H01L 27/0924* (2013.01); *H01L 27/1211* (2013.01); *H01L 29/66795* (2013.01); *H01L 29/785* (2013.01); *H01L 29/7848* (2013.01); *H01L 29/7851* (2013.01); *H04L 51/02* (2013.01); *H04L 51/046* (2013.01); *H04L 65/403* (2013.01)

(58) Field of Classification Search
    CPC ........... H01L 29/7848; H01L 29/66795; H01L 21/845; H01L 21/823821; H01L 21/02592; H01L 21/02675; H01L 29/7851; H01L 21/823431; H01L 21/308; G10L 15/26; H04L 65/403; H04L 51/046; H04L 51/02
    USPC ......................................................... 709/206
    See application file for complete search history.

(56) References Cited

U.S. PATENT DOCUMENTS

| | | | |
|---|---|---|---|
| 2005/0267763 A1* | 12/2005 | Ojanpera | G10L 19/008 704/500 |
| 2013/0173723 A1 | 7/2013 | Herold et al. | |
| 2015/0066479 A1* | 3/2015 | Pasupalak | G06F 40/20 704/9 |
| 2016/0300570 A1 | 10/2016 | Gustafson et al. | |
| 2016/0352567 A1* | 12/2016 | Robbins | H04L 41/0806 |
| 2017/0269972 A1* | 9/2017 | Hosabettu | G06F 9/4843 |
| 2017/0358299 A1 | 12/2017 | Schlesinger et al. | |
| 2017/0366478 A1* | 12/2017 | Mohammed | H04L 51/02 |
| 2018/0176269 A1* | 6/2018 | Griffin | H04L 65/403 |

* cited by examiner

BOT GROUP MESSAGING USING BOT-SPECIFIC VOICE LIBRARIES

CROSS REFERENCE TO RELATED APPLICATIONS

This application claims priority to and benefit from provisional U.S. Patent Application No. 62/477,082, filed on Mar. 27, 2017, by the same title, which is expressly incorporated by reference herein.

BACKGROUND

With the worldwide proliferation of the internet, providing goods and services to users and consumers has become more commonplace and automated. One way that automatically providing increased numbers of goods and services is through bots. An internet Bot, also known as web robot, WWW robot or simply bot, is a software application that runs automated tasks (scripts) over the internet. Typically, bots perform tasks that are both simple and structurally repetitive, at a much higher rate than would be possible for a human alone. The largest current use of bots is in web spidering or web crawling, in which an automated script fetches, analyzes and files information from web servers at many times the speed of a human. More than half of all web traffic is made up of bots.

Some bots communicate with other users of internet-based services, via Instant Messaging (IM), Internet Relay Chat (IRC), or another web interface such as Facebook Bots and Twitterbots. These chatterbots may allow people to ask questions in plain English and then formulate a proper response. These bots can often handle many tasks, including reporting weather, zip-code information, sports scores, converting currency or other units, etc. Others are used for entertainment, such as SmarterChild on AOL Instant Messenger and MSN Messenger. An additional role of IRC bots may be to lurk in the background of a conversation channel, commenting on certain phrases uttered by the participants (based on pattern matching). This is sometimes used as a help service for new users, or for censorship of profanity.

General-purpose bots, such as Amazon's Alexa, Microsoft's Cortana, Google's Assistant, and Apple's Siri, are digital personal assistants able to provide a wide range of consumer-oriented voice-activated services, including turning lights on/off, controlling appliances, playing requested music from services such as Pandora or Spotify, providing requested information, or ordering products or services.

Overview

With increasing interest in bot-based platforms and internet ease of use, it is desirable to create a new generation of messaging services that allow groups of users to interact with both user-oriented bots as well as group-oriented bots. The present disclosure provides advantages for bot environments. Methods, apparatuses, and computing systems are provided for bot messaging.

In an implementation, a method may include one or more of receiving, by a group messaging service coupled to the internet and a group including one or more user nodes, a message including recorded audio and a first group identifier, and determining that the group includes a bot, the bot including a software application for performing one or more tasks over the internet. The method also includes determining whether the bot is a user bot responsive to a user node in the group or a group bot responsive to each of the one or more user nodes, selecting a bot voice library commanded by the bot to process the recorded audio, sending, by the group messaging service, the recorded audio to the determined user bot or group bot, processing, by a speech-to-text converter and a natural language unit of the selected bot voice library, the recorded audio to produce enhanced text, performing, by the determined user bot or group bot, one or more designated actions corresponding to one of the recorded audio and the enhanced text, and sending, by the determined user bot or group bot, an audio reply to the group messaging service.

In another implementation, a non-transitory computer readable storage medium is provided. The non-transitory computer readable storage medium is configured to store computer instructions that when executed cause a processor to perform one or more of receiving, by a group messaging service coupled to the internet and a group including one or more user nodes, a message including recorded audio and a first group identifier, and determining that the group includes a bot, the bot including a software application for performing one or more tasks over the internet. The processor also performs determining whether the bot is a user bot responsive to a user node in the group or a group bot responsive to each of the one or more user nodes, selecting a bot voice library commanded by the bot to process the recorded audio, sending, by the group messaging service, the recorded audio to the determined user bot or group bot, processing, by a speech-to-text converter and a natural language unit of the selected bot voice library, the recorded audio to produce enhanced text, performing, by the determined user bot or group bot, one or more designated actions corresponding to one of the recorded audio and the enhanced text, and sending, by the determined user bot or group bot, an audio reply to the group messaging service.

In yet another implementation, a computing system is provided. The computing system includes one or more of a storage system including program instructions and a processing system, operably coupled to the storage system. Program instructions when executed by the processing system are directed to receive, by a group messaging service coupled to the internet and a group including one or more user nodes, a message including recorded audio and a first group identifier, and determine that the group includes a bot, the bot including a software application for performing one or more tasks over the internet. The processor is also directed to determine whether the bot is a user bot responsive to a user node in the group or a group bot responsive to each of the one or more user nodes, select a bot voice library commanded by the bot to process the recorded audio, send, by the group messaging service, the recorded audio to the determined user bot or group bot, process, by a speech-to-text converter and a natural language unit of the selected bot voice library, the recorded audio to produce enhanced text, perform, by the determined user bot or group bot, one or more designated actions corresponding to one of the recorded audio and the enhanced text, and send, by the determined user bot or group bot, an audio reply to the group messaging service.

This overview is provided to introduce a selection of concepts in a simplified form that are further described below in the Technical Disclosure. It may be understood that this overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several

DETAILED DESCRIPTION

The following figures and description describe various embodiments that may be used to provide bot messaging in group user node environments. Many arrangements of messaging systems 100, 200, 400, 600, 700, 900, and 1000 are possible, and the illustrated arrangements should be viewed as only exemplary arrangements of many such possible organizations.

Figure 1:
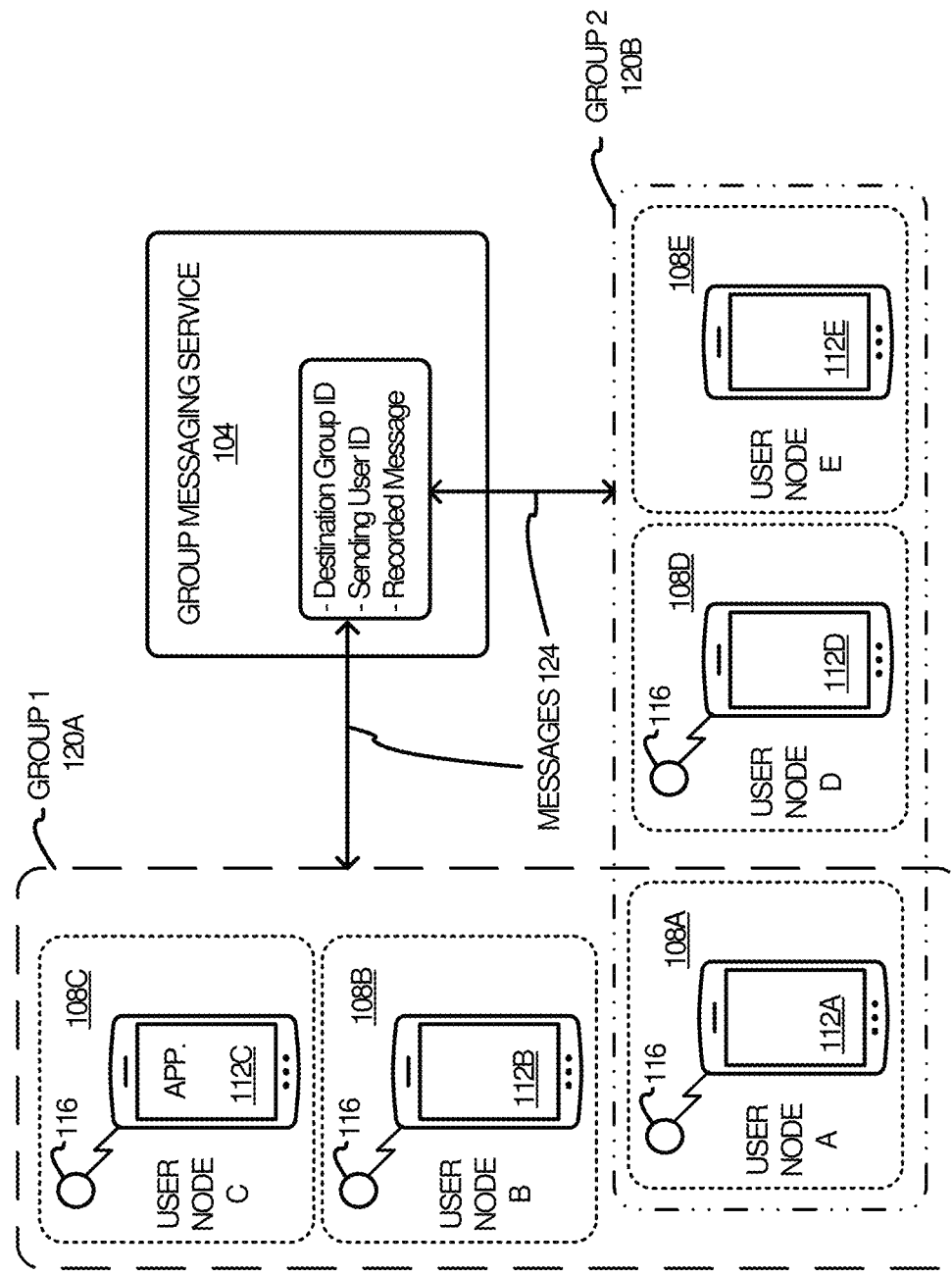
FIG. 1 illustrates a group messaging system in accordance with embodiments of the present disclosure.

FIG. 1 illustrates a group messaging system 100 in accordance with embodiments of the present disclosure. Group messaging system 100 includes at least user nodes 108 and a group messaging service 104. The group messaging service 104 includes one or more computers or servers that facilitate communication between user nodes 108. Each user node 108 includes at least a mobile device 112, including smart phones, PDAs, or certain wearable computers. In some embodiments, user nodes 108 include a wearable pendant 116 for wireless bidirectional audio communication with the mobile device 112. In other embodiments, user nodes 108 do not include a wearable pendant 116. In one embodiment, the wireless bidirectional communication protocol uses Bluetooth LE. Mobile device 112 may also include one or more embedded or downloadable software applications that facilitate audio communication between the wearable pendant 116 and other user nodes 108 or the group messaging service 104.

User nodes 108 may be organized into one or more groups 120, where each group 120 includes at least one user node 108. In the exemplary embodiment illustrated in FIG. 1, two groups 120 are present in the group messaging system 100, identified as group 1 120A and group 2 120B. Group 1 120A includes three user nodes 108, identified as user node A 108A, user node B 108B, and user node C 108C. Each of the three user nodes 108 in group 1 120A includes a wearable pendant 116. Group 2 120B also includes three user nodes 108, identified as user node A 108A, user node D 108D, and user node E 108E. User node A 108A and user node D 108D each include a wearable pendant 116, while user node E 108E does not include a wearable pendant 116. In the absence of a wearable pendant 116, the user for user node E 108E communicates with the mobile device 112E as they would with any smart phone or similar mobile device 112.

Notably, both group 1 120A and group 2 120B include user node A 108A. A given user node 108 may be in none, one, or any number of groups 120. Multiple groups 120 may include different user nodes 108, or exactly the same user nodes 108. There is no limit to the association between user nodes 108 and groups 120.

When a user node 108 of a group 120 communicates with another group 120 through the group messaging service 104, messages 124 are sent wirelessly and through the internet between the communicating user nodes 108 and the group messaging service 104. Messages 124 include recorded audio (a recorded message) as well as an ID of the sending user node 108 and a group ID for the destination group the message is being delivered to. The group messaging service 104 receives the message 124, identifies the group ID associated with the message 124, looks up the user nodes 108 contained within the destination group 120, and transmits the message 124 including the ID of the sending user node 108 to each of the user nodes 108 in the destination group 120. For example, if the user of user node B 108B wanted to send a message 124 to group 2 120B, the user of user node B 108B would speak into the wearable pendant 116 and identify group 2 120B as the destination for the message 124 while speaking the audio for the message into the wearable pendant 116. An application on mobile device 112B would then create a message 124 including recorded audio as described above and send the message 124 to the group messaging service 104. The software application on the mobile device 112B would have been previously configured with the group messaging service 104. The group messaging service 104 would then receive, analyze, and transmit the message 124 to each of the user nodes in group 2 120B as described earlier. Finally, each of the users of user node A 108A, user node D 108D, and user node E 108E would receive and hear the audio for the message 124 sent by the user of user node B 108B. Use of groups 120 as described herein does not preclude sending messages 124 directly from one user node 108 to a different user node 108.

Figure 2:
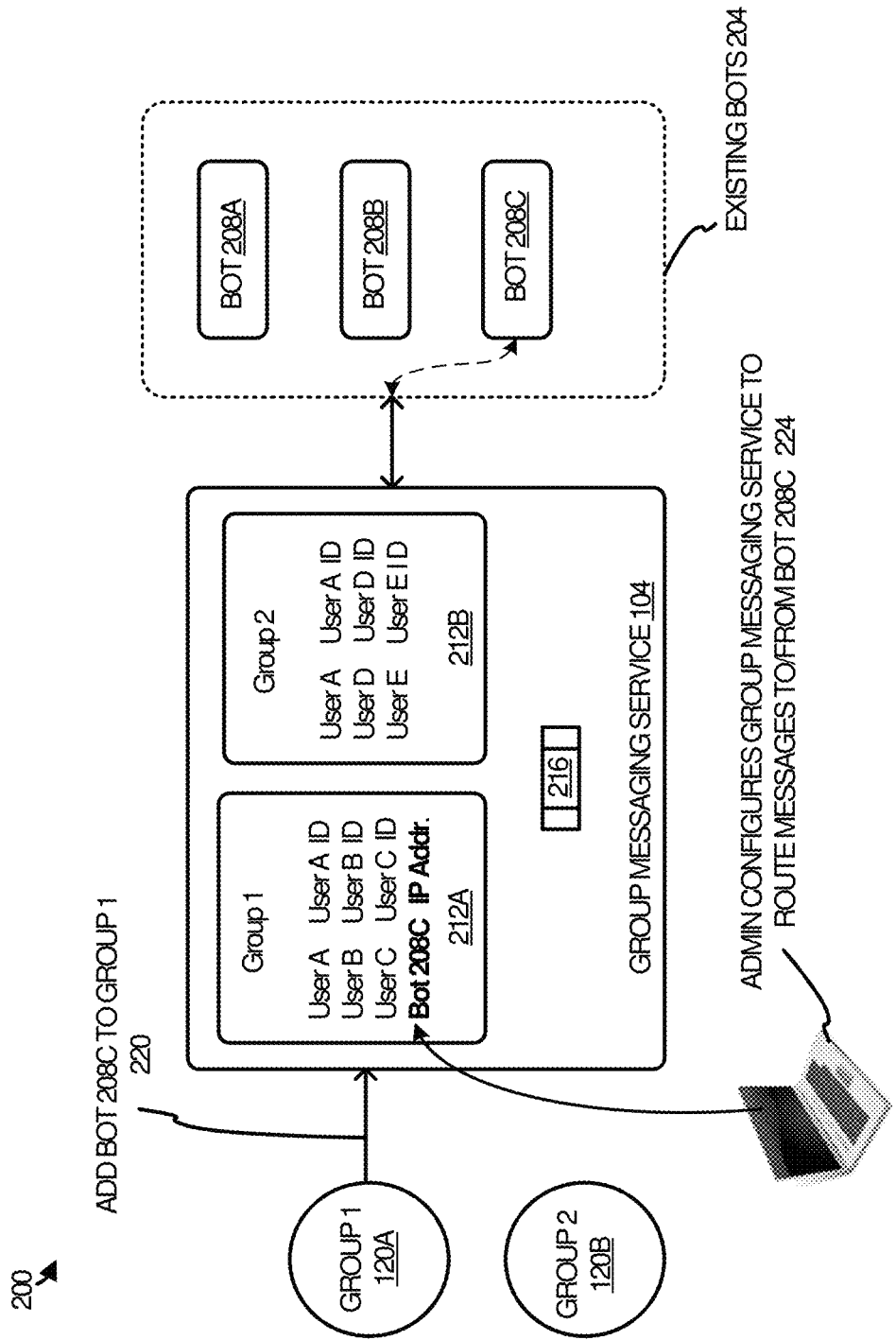
FIG. 2 illustrates a messaging flow for configuring a bot into a group in accordance with embodiments of the present disclosure.

FIG. 2 illustrates a messaging flow for configuring a bot 208 into a group 120 in accordance with embodiments of the present disclosure. System 200 includes one or more groups 120 as described with reference to FIG. 1, a group messaging service 104, and one or more existing bots 204. Bots 208 are software applications for performing one or more tasks over the internet. Therefore, bots 208 are internet-connected and in most embodiments are separate from the group messaging service 104.

Bots 208 may be incorporated into groups 120 by configuring each bot 208 in the group messaging service 104 in a similar fashion to user nodes 108. Group messaging service 104 includes data structures 212 for specifying which user nodes 108 and bots 208 are in each group 120. Each such data structure 212 includes identifiers and addresses for each user node 108 and bot 208 entity in the data structure 212. Group messaging service 104 in group messaging system 200 includes two group data structures 212, identified as group 1 data structure 212A and group 2 data structure 212B. Data structure 212A includes identifiers and addresses for each of the user nodes 108 in group 1 120. Using the example shown in FIG. 1, data structure 212A includes a user node A 108A address and identifier, a user node B 108B address and identifier, and a user node C 108C address and identifier. Data structure 212B includes a user node A 108A address and identifier, a user node D 108D address and identifier, and a user node E 108E address and identifier. Group messaging service 104 may include any number of data structures 212, and a given bot 208 may be included in any number of data structures 212. Data structures 212 may include service IDs or identifiers for any user nodes 108, as well. Service IDs may be anything, including a user name, and email address, or anything else that uniquely identifies a user or user node 108.

A user of a user node 108 initiates adding a bot 208 to a group 120. In the example illustrated in FIG. 2, a user in group 1 120A sends a configuration message 220 to the group messaging service 104 through the application on a corresponding mobile device 112 requesting a specific bot 208C the user has identified be added to group 1 120A. The user may not have the address of the requested bot 208C, but is at least able to uniquely identify the requested bot 208C. It is assumed that multiple existing bots 204 may be available to be messaged, and in the example of FIG. 2, bots 208A, 208B, and 208C are available.

In response to the group messaging service 104 receiving the message 220 for bot 208C in group 1 120A, a system administrator associated with the group messaging service configures 224 data structure 212A to route messages to or from bot 208C. A bot 208C address and identifier is added to data structure 212A for group 1. In some embodiments, the system administrator may need to obtain information associated with bot 208C in order to configure data structure 212A. Typically, once the system administrator has completed configuring bot 208C into the group 1 data structure 212A, the system administrator sends a configuration message (not shown) to the group 1 120A user that sent the request 220 to add bot 208C to group 1 120. At this point, bot 208C is configured into group 1 120A along with user nodes 108A, 108B, and 108C and ready to receive messages from any user node 108 in group 1 120A. Group messaging service 104 also includes a process 216 for sending messages to a bot 208 configured in a group 120.

Figure 3:
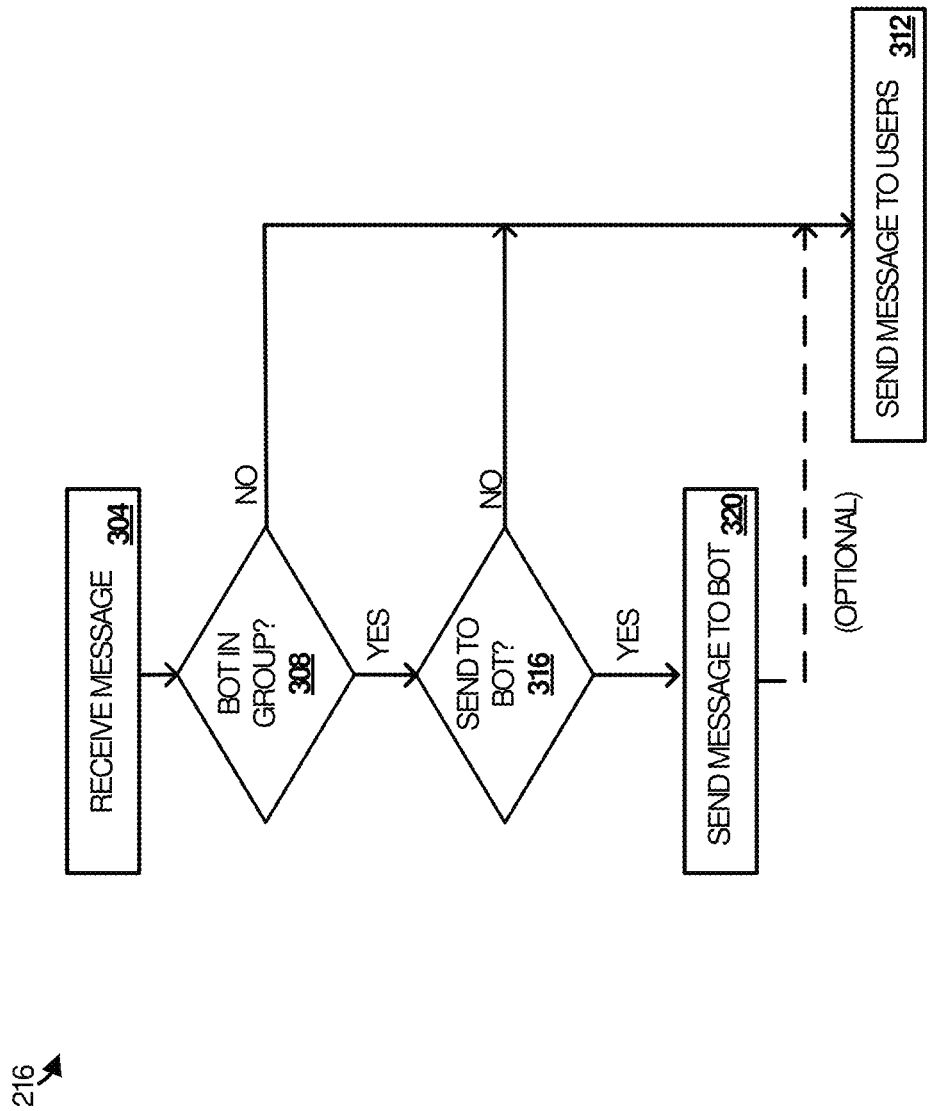
FIG. 3 illustrates a flowchart of a bot messaging process in accordance with embodiments of the present disclosure.

FIG. 3 illustrates a flowchart of a bot messaging process 216 in accordance with embodiments of the present disclosure. The bot messaging process 216 allows a user node 108 to send a message 124 to a bot 208 in a group 120. Once a bot 208 is configured into a group 120, a user node 108 may send and receive messages to and from the bot 208 through the group messaging service 104. Flow begins at block 304.

At block 304, the group messaging service 104 receives a message 124 from a user node 108 in a group 120. The message 124 includes recorded audio, a destination group 120 identifier, a bot identifier (if the message 124 is intended to be sent to a bot 208), and an identifier of the user node 108 sending the message 124. Flow proceeds to decision block 308.

At block 308, the group messaging service 104 determines if there is a bot 208 configured in the group 120 corresponding to the destination group identifier. If there is a bot 208 configured in the group 120 corresponding to the destination group identifier, then flow proceeds to decision block 316. If there is not a bot 208 configured in the group 120 corresponding to the destination group identifier, then flow instead proceeds to block 312.

At block 312, the group messaging service 104 has determined that a bot 208 is not configured in the group 120 corresponding to the destination group identifier, and therefore sends the received message 124 to the user nodes 108 within the destination group 120. Addresses for the user nodes 108 within the destination group 120 are determined by reviewing the data structure 212 within the group messaging service 104 corresponding to the destination group 120. Flow ends at block 312, or the group messaging service 104 returns to block 304 to wait for a next received message 124.

At decision block 316, the group messaging service 104 determines if the received message 124 should be sent to a specific bot 208. The group messaging service 104 reviews the data structure 212 corresponding to the destination group 120, and identifies a bot entry 504 corresponding to the bot identifier in the received message 124. A data structure 212 may include any number of bot entries 504. If there is a match, and a bot entry 504 in the data structure 212 matches the bot identifier, then flow proceeds to block 320. If there is not a match, and no bot entries 504 in the data structure 212 matches the bot identifier, then flow instead proceeds to block 312.

At block 320, the group messaging service 104 has identified a match between the received message 124 and the data structure 212 corresponding to the destination group 120, and sends the message 124 to the selected bot 208. At this point, the message 124 has been delivered to the addressed bot 208, and the addressed bot 208 carries out one or more functions corresponding to recorded audio within the message 124. In some embodiments, the bot 208 provides a data or audio acknowledgment back to the group messaging service 104, and in turn the group messaging service 104 provides the data or audio acknowledgment back to the user node 108 that sent the original message 124 or the group 120 that includes the user node 108 that sent the original message 124. In some embodiments, after the group messaging service 104 sends the message 124 to the selected bot 208, flow proceeds to block 312 and the group messaging service 104 sends the message 124 to other users and user nodes 108 within the same group 120 as the user node 108 that sent the original message 124.

Figure 4:
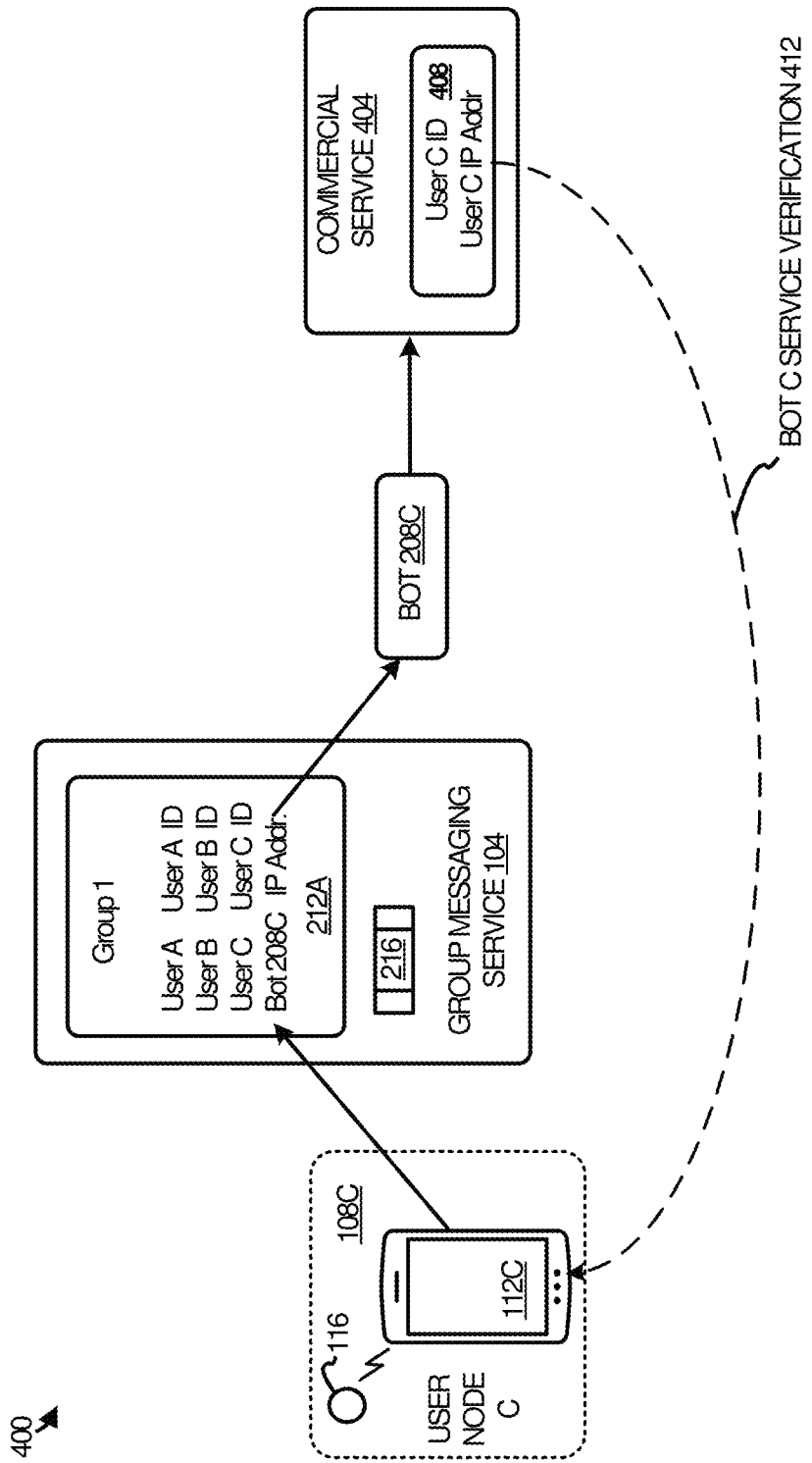
FIG. 4 illustrates a messaging flow for a user node in accordance with embodiments of the present disclosure.

FIG. 4 illustrates a messaging flow 400 for a user node 108 in accordance with embodiments of the present disclosure. The present invention allows users and user nodes 108 to send messages 124 through a group messaging service 104 to one or more bots 208, and have the one or more bots 208 perform various tasks related to the functionality of the one or more bots 208.

In some cases, bots 208 may provide enhanced functionality beyond providing information back to a requesting user node 108. For example, a bot 208 may be associated with one or more commercial services 404 that may allow purchase, sale, or other financial or more complex transactions. Bot 208 may parse message inputs to determine service handles corresponding to specific commercial services 404. In some embodiments, commercial services 404 may be associated with different user accounts, for example an account associated with a specific user or user node 108 and another account associated with a group 120. In order to utilize such commercial services 404, it is generally necessary to configure the commercial service 404 with various information 408 related to the user and user node 108 sourcing the transaction. In some embodiments, the commercial service 404 is configured at least with a user ID and a user address or IP address corresponding to a user and user node 108 who intends to use the commercial service 404. In other embodiments, the commercial service 404 is further configured with other information 408 such as, but not limited to, credit card numbers, credit card expiration dates, passwords, authentication keys, or any other information.

In the exemplary embodiment illustrated in group messaging system 400, user node C 108C sends a message 124 specifying bot 208C to the group messaging service 104. As described with reference to FIG. 3, the group messaging service 104 identifies bot 208C is a valid recipient of the message 124, and forwards the message 124 to bot 208C. Bot 208C is associated with commercial service 404, and passes along information within the message 124 to the commercial service 404. The commercial service 404 verifies the information within the message 124 by comparing it to information 408 within the commercial service 404 that has previously been configured.

In some embodiments, commercial service 404 sends a message 412 to user node C 108C requesting service verification. For example, for improved security it may be beneficial to provide user verification for a financial transaction that may have impacts to financial accounts associated with the user of user node C 108C. In most embodiments, an application on mobile device 112C receives and displays the service verification 412 to the user, and the user verifies the transaction through the application. The application then replies to the service verification 412 and sends a reply back to the commercial service 404, where the requested transaction is then executed and acknowledged. In one embodiment, the service verification 412 and reply are sent through a different messaging channel than messages 124 that go through the group messaging service 104. In other embodiments, the service verification 412 and reply are sent through the same messaging channel than messages 124 that go through the group messaging service 104.

Figure 5:
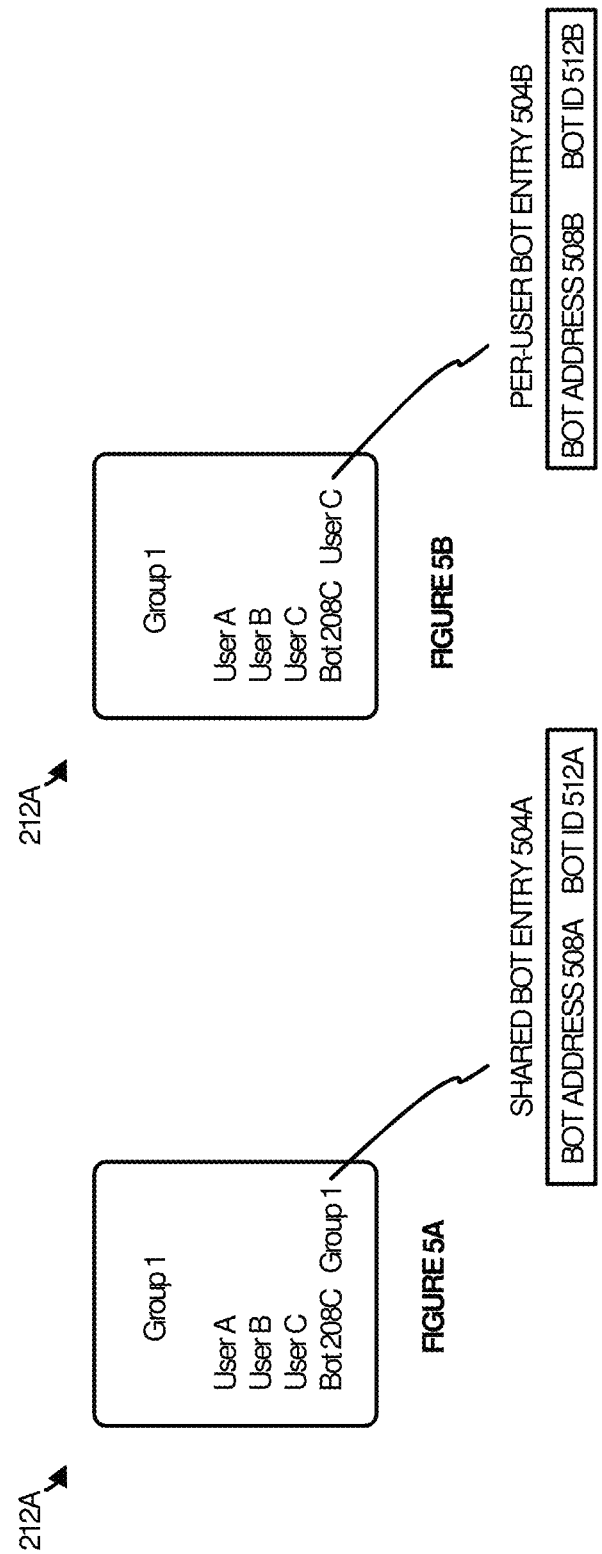
FIG. 5A illustrates a shared bot entry within a data structure in accordance with embodiments of the present disclosure.
FIG. 5B illustrates a per-user bot entry within a data structure in accordance with embodiments of the present disclosure.

FIG. 5A illustrates a shared bot entry 504A within a data structure 212A in accordance with embodiments of the present disclosure. Data structures 212 may be configured one of two ways, depending on desired bot 208 performance within a group 120. In a first embodiment, data structure 212A includes a bot entry 504A that designates bot 208C as a shared bot 208. Shared bot entry 504A includes a bot address 508A and a bot identifier or ID 512A. A shared bot 208 is identified by a group 120 designation within the bot entry 504A. When a group 120 designation appears within a bot entry 504A, the group messaging service 104 treats the corresponding bot 208 (bot 208C) as a shared bot within the corresponding group 120 (group 1, as shown).

FIG. 5B illustrates a per-user bot 208 within a data structure 212A in accordance with embodiments of the present disclosure. Data structures 212 may be configured one of two ways, depending on desired bot 208 performance within a group 120. In a second embodiment, data structure 212A includes a per-user bot entry 504B that designates bot 208C as a per-user bot 208. Per-user bot entry 504B includes a bot address 508B and a bot identifier or ID 512B. A per-user bot 208 is identified by a user or user node 108 designation within the bot entry 504B. When a user or user node 108 designation appears within a bot entry 504B, the group messaging service 104 treats the corresponding bot 208 (bot 208C) as a dedicated bot 208 to a corresponding user or user node 108 (user C, as shown).

Figure 6:
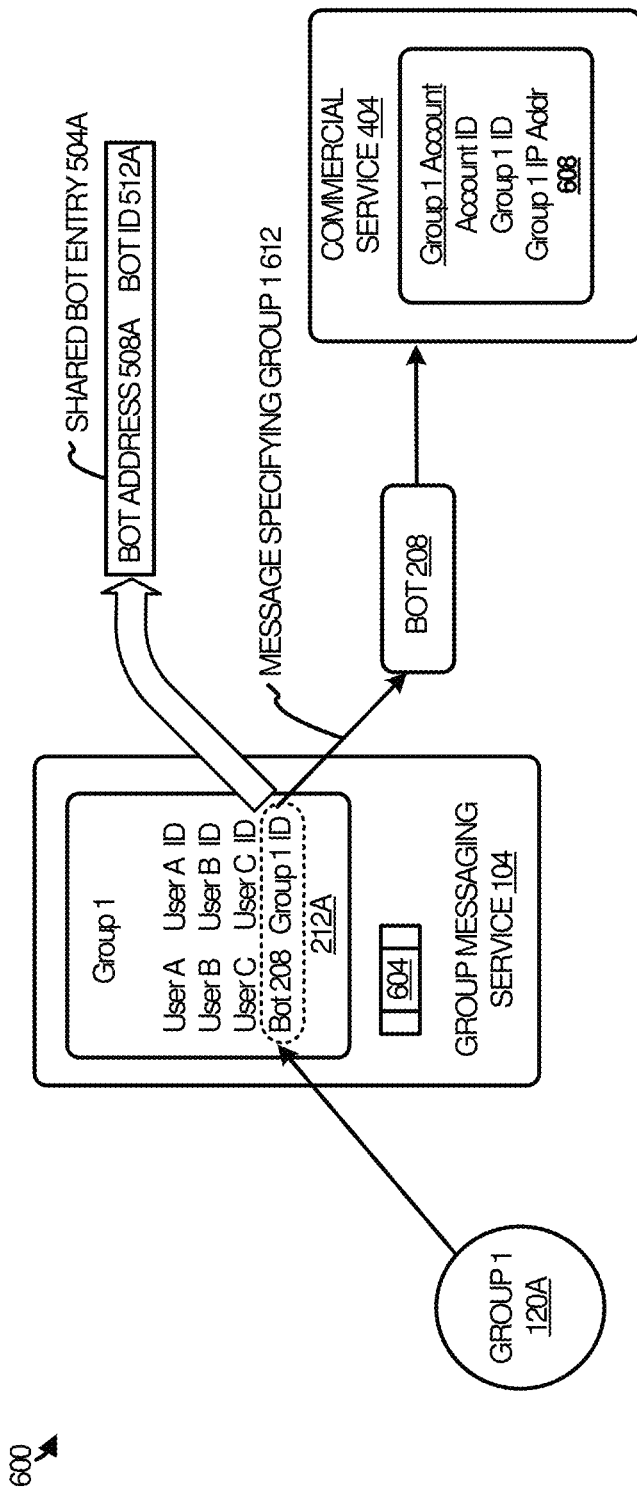
FIG. 6 illustrates messaging using a shared bot with a commercial service in accordance with embodiments of the present disclosure.

FIG. 6 illustrates messaging using a shared bot 208 with a commercial service 404 in accordance with embodiments of the present disclosure. The present invention allows users and user nodes 108 to send messages 124 through the group messaging service 104 to one or more shared bots 208, and have the one or more shared bots 208 perform various tasks related to the functionality of the one or more shared bots 208. As described with reference to FIG. 5A, shared bots 208 are bots 208 assigned to a specific group 120 instead of a specific user or user node 108. Any user node 108 within a group 120 may send a message to a shared bot 208 configured within the same corresponding group's data structure 212A, and the group messaging service 104 will respond accordingly. Otherwise, the group messaging service 104 will send a notification to the requesting user or user node 108 that the shared bot 208 is currently not assigned to the group 120 of the requesting user or user node 108.

Data structure 212A includes one or more shared bot entries 504A. Data structure 212A may also contain both shared bot entries 504A and per-user bot entries 504B. Each shared bot entry 504A includes a bot address 508A and a bot identifier or ID 512A. Group messaging service 104 includes a process 604, shown in more detail in FIG. 8, that selects a specific shared bot entry 504A corresponding to the message 124, and sends a message specifying the group ID 612 to the selected shared bot 208. It should be understood that the shared bot 208, and the commercial service 404 if applicable, provides a response to the group messaging service 104 at least related to completion of the requested task in the message 612. The group messaging service 104 would then provide a notification to each of the user nodes 108 in the requesting group 120A.

In some cases, shared bots 208 may provide enhanced functionality beyond providing information back to a requesting user node 108. For example, a shared bot 208 may be associated with one or more commercial services 404 that may allow purchase, sale, or other financial or more complex transactions. In order to utilize such commercial services 404, it is generally necessary to configure the commercial service 404 with various information 608 related to the group 120 and user node 108 sourcing the transaction. In the case of a shared bot 208, the commercial service 404 is configured at least with an account ID, an ID corresponding to the group 120, and an IP address corresponding to the group 120 for the user nodes 108 whose users intend to use the commercial service 404. In other embodiments, the commercial service 404 is further configured with other information 608 such as, but not limited to, credit card numbers, credit card expiration dates, passwords, authentication keys, or any other information.

In the exemplary embodiment illustrated in group messaging system 600, a user node 108 in group 1 120A sends a message 124 specifying shared bot 208 to the group messaging service 104. As described with reference to FIG. 6, the group messaging service 104 identifies shared bot 208 is a valid recipient of the message 124, and forwards the message 124 to shared bot 208. Shared bot 208 is associated with commercial service 404, and passes along information within the message 124 to the commercial service 404. The commercial service 404 verifies the information within the message 124 by comparing it to information 608 within the commercial service 404 that has previously been configured for the group 120.

In one embodiment, the group messaging service 104 and data structure 212A may be configured to forward all messages 124 from group 1 120A to a specific bot 208, without the specific bot 208 being explicitly addressed. In this way, a specific bot 208 may be effectively monitoring all conversations within group 1 120A between user nodes 108 of group 1 120A, and acting upon predetermined identified audio within each recorded message 124.

In some embodiments (not shown), commercial service 404 sends a message to one or more user nodes 108 of the corresponding group 120 requesting service verification. For example, for improved security it may be beneficial to provide user verification for a financial transaction that may have impacts to financial accounts associated with the group 120. In most embodiments, an application on mobile devices 112 in the group 120 receives and displays the service verification to the user(s), and the user(s) verify the transaction through a mobile device 112 application. The application then replies to the service verification and sends a reply back to the commercial service 404, where the requested transaction is then executed and acknowledged. In one embodiment, the service verification and reply are sent through a different messaging channel than messages 124 that go through the group messaging service 104. In other embodiments, the service verification and reply are sent through the same messaging channel than messages 124 that go through the group messaging service 104.

Figure 7:
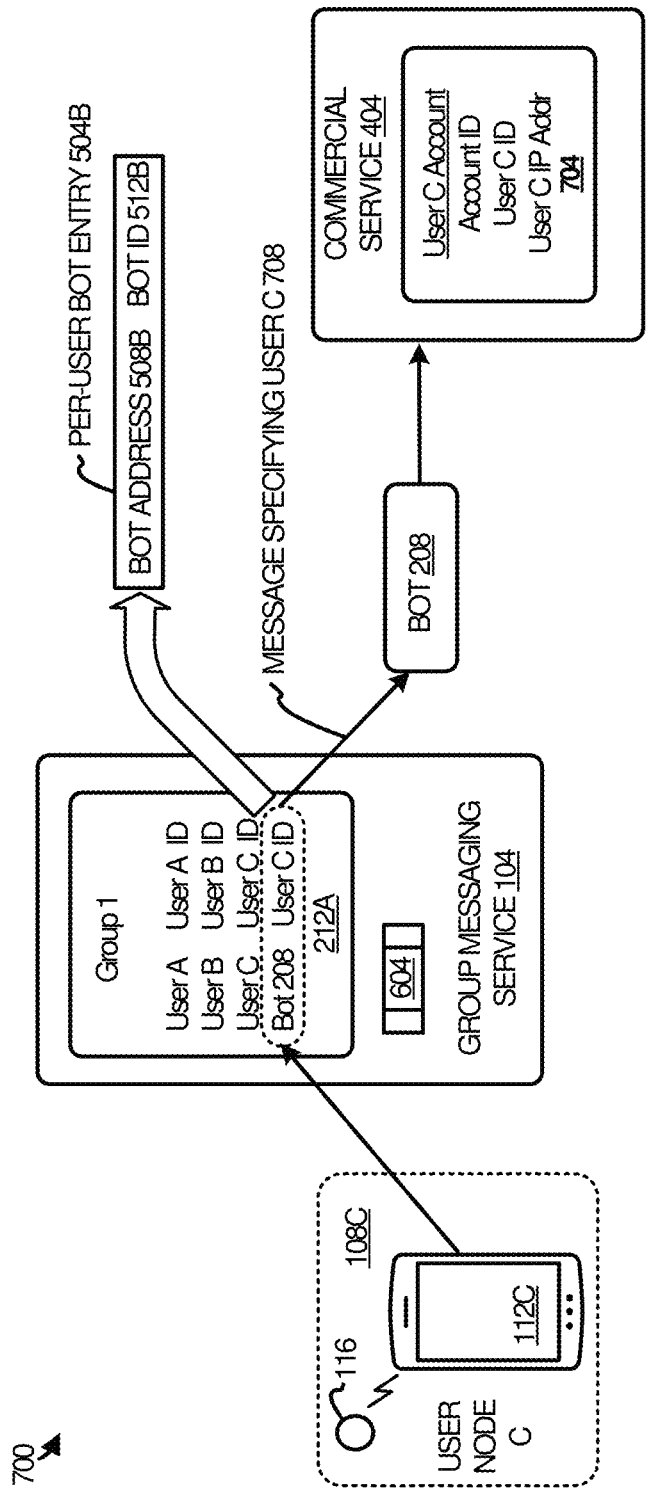
FIG. 7 illustrates messaging using a per-user bot with a commercial service in accordance with embodiments of the present disclosure.

FIG. 7 illustrates messaging using a per-user bot 208 with a commercial service 404 in accordance with embodiments of the present disclosure. The present invention allows users and user nodes 108 to send messages 124 through the group messaging service 104 to one or more per-user bots 208, and have the one or more per-user bots 208 perform various tasks related to the functionality of the one or more per-user bots 208. As described with reference to FIG. 5B, per-user bots 208 are bots 208 assigned to a specific user or user node 108 instead of a group 120. Any user node 108 within a group 120 may send a message 124 to a per-user bot 208 configured within the corresponding group's data structure 212A, and the group messaging service 104 will process the message to the per-user bot 208 if the per-user bot 208 is configured to the sending user or user node 108C. Otherwise, the group messaging service 104 will send a notification to the requesting user or user node 108 that the per user bot 208 is currently not assigned to the requesting user or user node 108.

Data structure 212A includes one or more per-user bot entries 504. Data structure 212A may also contain both shared bot entries 504A and per-user bot entries 504B. Each per-user bot entry 504B includes a bot address 508B and a bot identifier or ID 512B. Group messaging service 104 includes a process 604, shown in more detail in FIG. 8, that selects a specific per-user bot entry 504A corresponding to the message 124, and sends a message specifying the user ID 708 to the selected per-user bot 208. It should be understood that the per-user bot 208, and the commercial service 404 if applicable, provides a response to the group messaging service 104 at least related to completion of the requested task in the message 708. The group messaging service 104 would then provide a notification to the user node 108C that sent the original message 124.

In some cases, per-user bots 208 may provide enhanced functionality beyond providing information back to a requesting user node 108C. For example, a per-user bot 208 may be associated with one or more commercial services 404 that may allow purchase, sale, or other financial or more complex transactions. In order to utilize such commercial services 404, it is generally necessary to configure the commercial service 404 with various information 704 related to the user and user node 108C sourcing the transaction. In the case of a per-user bot 208, the commercial service 404 is configured at least with an account ID, an ID corresponding to the user or user node 108C, and an IP address corresponding to the user node 108C whose user intends to use the commercial service 404. In other embodiments, the commercial service 404 is further configured with other information 704 such as, but not limited to, credit card numbers, credit card expiration dates, passwords, authentication keys, or any other information.

In the exemplary embodiment illustrated in group messaging system 700, user node 108C sends a message 124 specifying per-user bot 208 to the group messaging service 104. As described with reference to FIG. 8, the group messaging service 104 identifies per-user bot 208 is a valid recipient of the message 124, and forwards the message 124 to per-user bot 208. Per-user bot 208 is associated with commercial service 404, and passes along information within the message 124 to the commercial service 404. The commercial service 404 verifies the information within the message 124 by comparing it to information 704 within the commercial service 404 that has previously been configured for the user and user node 108C.

In one embodiment, the group messaging service 104 and data structure 212A may be configured to forward all messages 124 from a specific user node C 108C to a specific bot 208, without the specific bot 208 being explicitly addressed. In this way, a specific bot 208 may be effectively monitoring all conversations from user node C 108C between user nodes 108 of group 1 120A, and acting upon identified audio within each recorded message 124 from user node C 108C.

In some embodiments (not shown), commercial service 404 sends a message to user node 108C requesting service verification. For example, for improved security it may be beneficial to provide user verification for a financial transaction that may have impacts to financial accounts associated with the user of user node 108C. In most embodiments, an application on mobile device 112 of user node 108C receives and displays the service verification to the user, and the user verifies the transaction through the mobile device 112 application. The application then replies to the service verification and sends a reply back to the commercial service 404, where the requested transaction is then executed and acknowledged. In one embodiment, the service verification and reply are sent through a different messaging channel than messages 124 that go through the group messaging service 104. In other embodiments, the service verification and reply are sent through the same messaging channel than messages 124 that go through the group messaging service 104.

Figure 8:
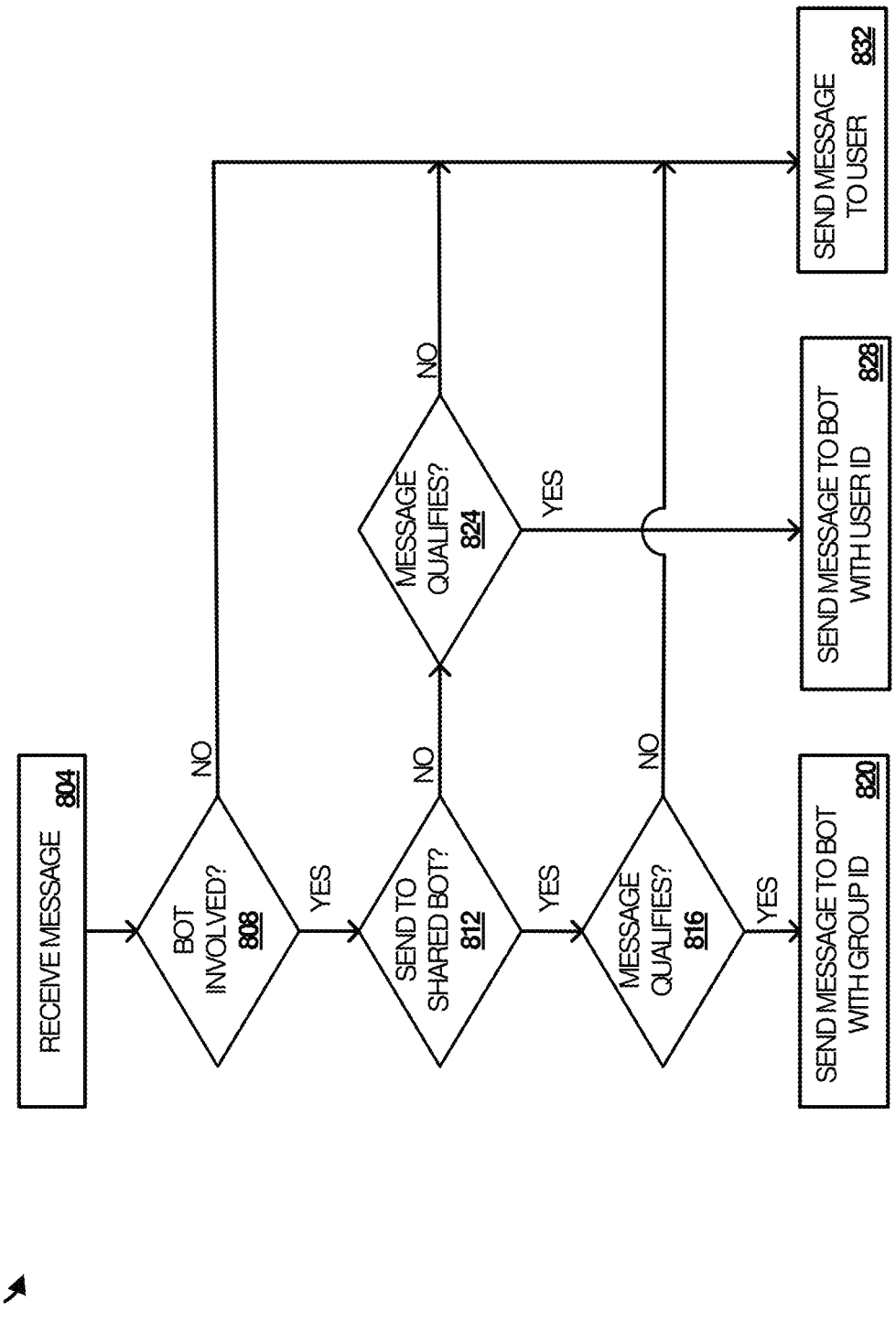
FIG. 8 illustrates a flowchart of a messaging process using shared or per-user bots in accordance with embodiments of the present disclosure.

FIG. 8 illustrates a flowchart of a messaging process 604 using shared or per-user bots 208 in accordance with embodiments of the present disclosure. The bot messaging process 604 allows a user node 108 to send a message 124 to either a shared bot 208 or a per-user bot 208 in a group 120. Once a bot 208 is configured into a group 120, a user node 108 may send and receive messages 124 to and from the bot 208 through the group messaging service 104. Flow begins at block 804.

At block 804, the group messaging service 104 receives a message 124 from a user node 108 in a group 120. The message 124 includes recorded audio, a destination group 120 identifier, a bot identifier (if the message 124 is intended to be sent to a bot 208), and an identifier of the user node 108 sending the message 124. Flow proceeds to decision block 808.

At block 808, the group messaging service 104 determines if there is a bot 208 configured in the group corresponding to the destination group 120 identifier. If there is a bot 208 configured in the group 120 corresponding to the destination group 120 identifier, then flow proceeds to decision block 812. If there is not a bot 208 configured in the group 120 corresponding to the destination group 120 identifier, then flow instead proceeds to block 832.

At decision block 812, the group messaging service 104 determines if the received message 124 should be sent to a specific shared bot 208. The group messaging service 104 reviews the data structure 212 corresponding to the destination group 120, and identifies a shared bot entry 504A corresponding to the bot identifier in the received message 124. A data structure 212 may include any number of shared or per-user bot entries 504A/504B. If there is a match, and a shared bot entry 504A in the data structure 212 matches the bot identifier, then flow proceeds to decision block 816. If there is not a match, and no shared bot entries 504A in the data structure 212 match the bot identifier, then the received message should be sent to a per-user bot 208 and flow instead proceeds to decision block 824.

At decision block 816, the group messaging service 104 determines if the message 124 qualifies. A qualified message 124 is a message with content that conforms with a bot entry 504A/504B in the data structure 212. With respect to decision block 816, since there is a bot 208 involved (decision block 808) and the bot 208 is a shared bot 208 (decision block 812), the message 124 must be sent by a user node 108 in the same data structure 212 as the shared bot 208. Therefore, a qualified user node 108 has transmitted the message 124 and is able to have the message 124 sent to the shared bot 208. If the message qualifies, then flow proceeds to block 820. If the message does not qualify, then flow instead proceeds to block 832.

At block 820, the group messaging service 104 has identified a match between the received message 124 and the data structure 212 corresponding to the destination group 120, and sends the message 124 to the selected shared bot 208. At this point, the message 124 has been delivered to the addressed shared bot 208, and the addressed shared bot 208 carries out one or more functions corresponding to recorded audio within the message 124. In some embodiments, the shared bot 208 provides a data or audio acknowledgment back to the group messaging service 104, and in turn the group messaging service 104 provides the data or audio acknowledgment back to the user node 108 that sent the original message 124 or the group 120 that includes the user node 108 that sent the original message 124. In some embodiments, after the group messaging service 104 sends the message 124 to the selected shared bot 208, flow proceeds to block 832 and the group messaging service 104 sends the message 124 to other users and user nodes 108 within the same group 120 as the user node 108 that sent the original message 124.

At decision block 824, the group messaging service 104 determines if the message 124 qualifies. A qualified message 124 is a message with content that conforms with a bot entry 504A/504B in the data structure 212. With respect to decision block 824, since there is a bot 208 involved (decision block 808) and the bot 208 is a per-user bot 208 (decision block 812), the message 124 must be sent by a user node 108 in the same data structure 212 as the per-user bot 208. Therefore, a qualified user node 108 has transmitted the message 124 and is able to have the message 124 sent to the per-user bot 208. If the message qualifies, then flow proceeds to block 828. If the message does not qualify, then flow instead proceeds to block 832.

At block 820, the group messaging service 104 has identified a match between the received message 124 and the data structure 212 corresponding to the destination group 120, and sends the message 124 to the selected per-user bot 208. At this point, the message 124 has been delivered to the addressed per-user bot 208, and the addressed per-user bot 208 carries out one or more functions corresponding to recorded audio within the message 124. The per-user bot 208 provides a data or audio acknowledgment back to the group messaging service 104, and in turn the group messaging service 104 provides the data or audio acknowledgment back to the user node 108 that sent the original message 124. In some embodiments, after the group messaging service 104 sends the message 124 to the selected per-user bot 208, flow proceeds to block 832 and the group messaging service 104 sends the message 124 to other users and user nodes 108 within the same group 120 as the user node 108 that sent the original message 124.

At block 832, the group messaging service 104 has determined that a bot 208 is not configured in the group corresponding to the destination group 120 identifier (decision block 808) or the message 124 is not qualified (decision block's 816 and 824), and therefore sends the received message 124 to the user nodes 108 within the destination group 120. Addresses for the user nodes 108 within the destination group 120 are determined by reviewing the data structure 212 within the group messaging service 104 corresponding to the destination group 120. Flow ends at block 832, or the group messaging service 104 returns to block 804 to wait for a next received message 124.

Figure 9:
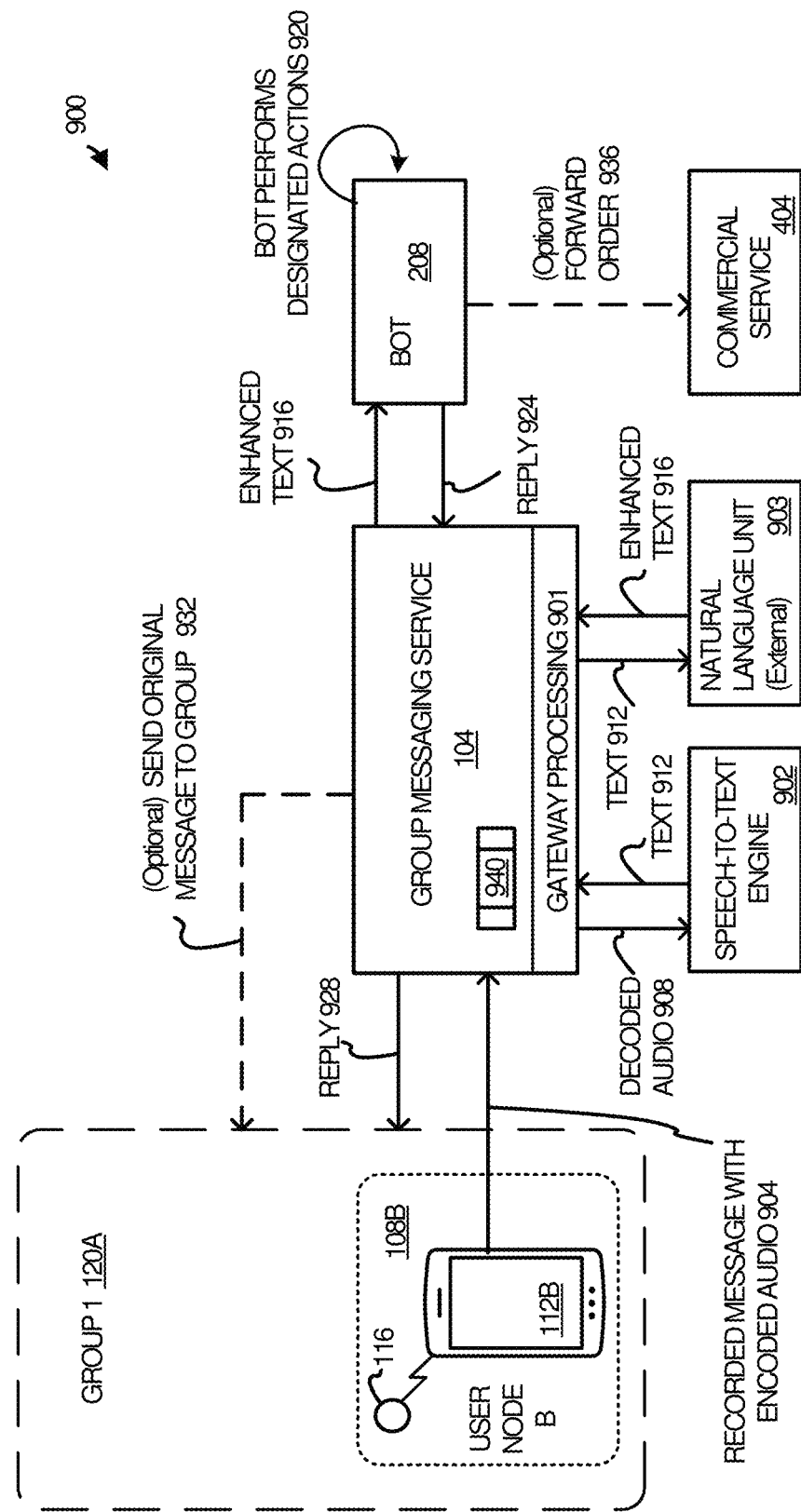
FIG. 9 illustrates a bot system architecture in accordance with a first embodiment of the present disclosure.

FIG. 9 illustrates a bot system 900 architecture in accordance with a first embodiment of the present disclosure. Once a group messaging service 104 has been configured to use one or more bots 208, user nodes 108 within groups 120 may send and receive messages from the bots 208. In some embodiments, bots 208 may be configured to respond to enhanced text 916, rather than recorded messages 124 as described previously. In such cases, group messaging service 104 must be able to convert audio from the recorded messages 124 into enhanced text 916 which may be sent to a bot 208 to execute one or more actions.

A group, such as group 1 120A includes one or more user nodes 108, including user node B 108B including mobile device 112B and wearable pendant 116. User node 108B sends a recorded message with encoded audio 904 to the group messaging service 104, where the recorded message 904 is directed to a bot 208 in group 1 120A. Group messaging service 104 decodes the encoded audio in the recorded message 904 to create decoded audio 908. Group messaging service 104 executes process 940 to identify a bot 208 and voice library, and direct the recorded message to users and bots 208 appropriately. Process 940 is shown and described in more detail with respect to FIG. 11.

Group messaging service 104 either includes a voice library as part of group messaging service 104, or has access to one or more remote voice libraries. Voice libraries include at least a speech-to-text engine 902 and a natural language unit 903. In some embodiments, the speech-to-text engine 902 is part of group messaging service 104 while the natural language unit 903 is remote. In other embodiments, the speech-to-text engine 902 is remote while the natural language unit 903 is part of group messaging service 104. Remote portions of the voice library are accessed through Gateway processing 901. Data structures 212 of the group messaging service 104 need to be configured as to whether voice libraries are required to be used for group messages, or not. For example, some bots 208 may require a voice library to be used while other bots 208 may not.

The group messaging service 104 sends the decoded audio to the speech-to-text engine 902, and the speech-totext engine 902 converts the decoded audio into text 912 and sends the text 912 to the group messaging service 104. In some embodiments, the speech-to-text engine 902 sends the text 912 directly to the natural language unit 903. After receiving the text 912, the group messaging service 104 sends the text 912 to the natural language unit 903, which reviews the text 912 and converts the text 912 into enhanced text 916. Enhanced text 916 is clarified and simplified from text 912 into a form more suitable for presentation to a bot 208 to execute. The natural language unit 903 sends the enhanced text 916 to the group messaging service 104.

After receiving the enhanced text 916 from the natural language unit 903, the group messaging service 104 sends the enhanced text 916 to the selected bot 208 corresponding to the recorded message 904. Bot 208 receives the enhanced text 916 and in response, performs one or more designated actions 920 corresponding to the decoded audio 908 and enhanced text 916. In some embodiments, bot 208 is associated with one or more commercial services 404, such as order management systems or systems involving various financial transactions. Bot 208 forwards an order 936 or other commercial service request to commercial service 404 for execution. As previously described, commercial service 404 would need to be previously configured by the user of user node B 108B with payment, account number, IP address, or any other required information. Commercial service 404, after verifying the transaction with mobile device 112B, then carries out the requested order 936. Bot 208 would then send a reply 924 to the group messaging service 104 with various information including at least completion of the request corresponding to the enhanced text 916.

In response to receiving the reply 924 from the bot 208, the group messaging service 104 forwards a reply 928 to group 1 120A including user node B 108B. Optionally, group messaging service 104 provides the original recorded message to the group 932 in order to inform other user nodes 108 of group 1 120A of the request made by user node B 108B. At this point, all actions with recorded message 904 have been carried out and the requested transaction has been completed.

Figure 10:
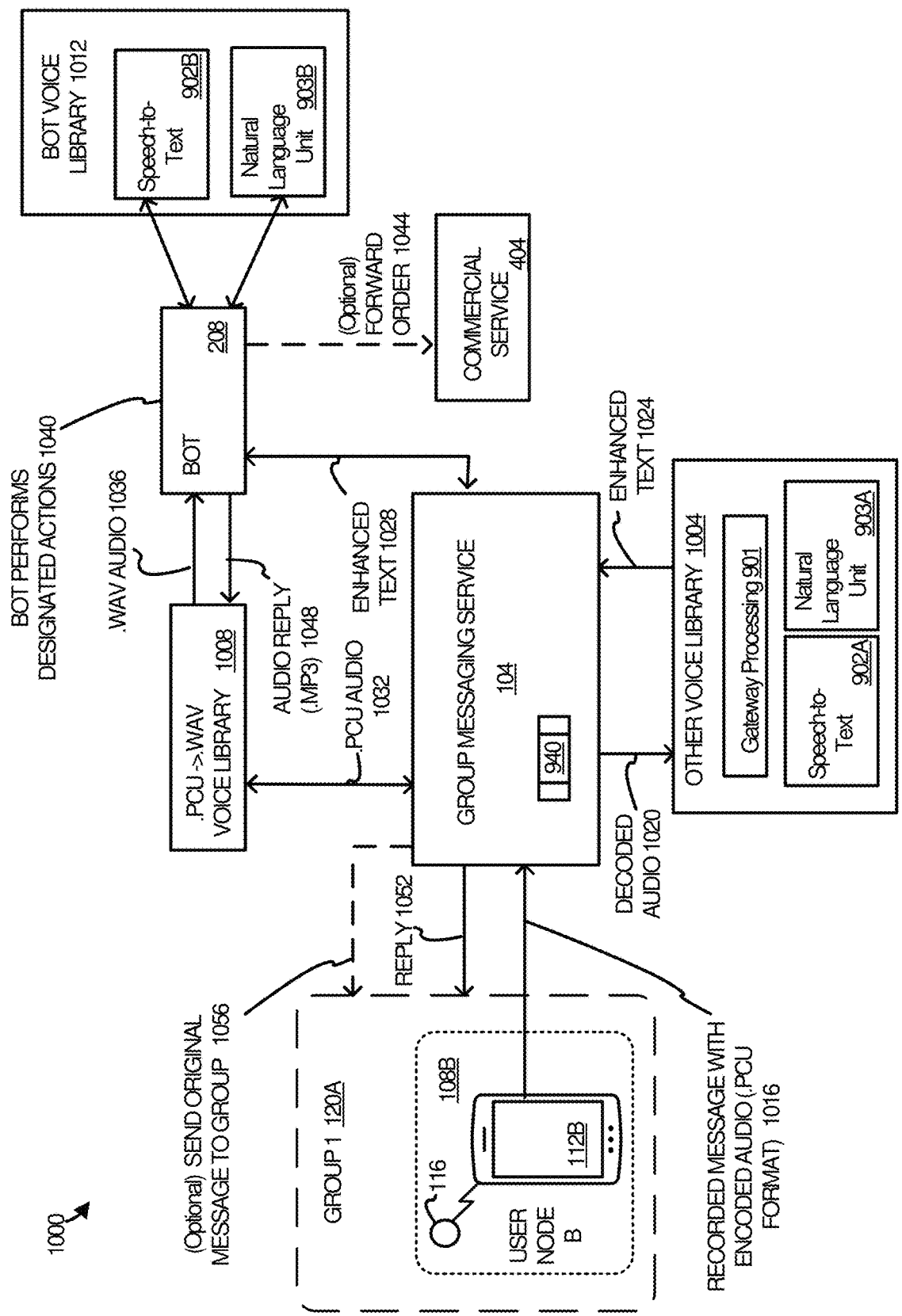
FIG. 10 illustrates a bot system architecture in accordance with a second embodiment of the present disclosure.

FIG. 10 illustrates a bot system 1000 architecture in accordance with a second embodiment of the present disclosure. FIG. 10 illustrates a more complex embodiment to that illustrated bot system 900 of FIG. 9. Bot system 1000 includes alternative voice libraries directly accessible by bot 208.

A group, such as group 1 120A includes one or more user nodes 108, including user node B 108B including mobile device 112B and wearable pendant 116. User node 108B sends a recorded message with encoded audio in a PCU format 1016 to the group messaging service 104, where the recorded message 904 is directed to a bot 208 in group 1 120A. Group messaging service 104 decodes the encoded audio in the recorded message 904 to create decoded audio 908. Group messaging service 104 executes process 940 to identify a bot 208 and voice library, and direct the recorded message to users and bots 208 appropriately. Process 940 is shown and described in more detail with respect to FIG. 11.

For embodiments where the group messaging service 104 interfaces with and controls voice libraries, group messaging service 104 either includes a voice library as part of group messaging service 104, or has access to one or more remote voice libraries 1004. Voice libraries 1004 include at least Gateway processing 901, a speech-to-text engine 902A and a natural language unit 903A. Voice libraries 1004 may be accessible through one or more application programming interfaces (APIs). In some embodiments, the speech-to-text engine 902A is part of group messaging service 104 while the natural language unit 903A is remote. In other embodiments, the speech-to-text engine 902A is remote while the natural language unit 903A is part of group messaging service 104. In some embodiments, a generic speech-to-text engine 902A may be used in conjunction with multiple natural language units 903. For example, one natural language unit 903 may be used for restaurant or food-related messages, another natural language unit 903 may be used for document or publication-related messages, and another natural language unit 903 may be used for scheduling related messages.

Data structures 212 of the group messaging service 104 need to be configured as to whether voice libraries are required to be used for group messages, or not. Also, if multiple voice libraries 1004, 1008, 1012 are available, data structures 212 may indicate which voice library is used for each bot 208. For example, some bots 208 may require a voice library to be used while other bots 208 may not.

The group messaging service 104 sends the decoded audio 1020 to the speech-to-text engine 902A, and the speech-to-text engine 902A converts the decoded audio into text and sends the text directly to the natural language unit 903A. The natural language unit 903A reviews the text and converts the text into enhanced text 1024, and sends the enhanced text 1024 to the group messaging service 104. Enhanced text 1024 is clarified and simplified text in a form more suitable for presentation to a bot 208 to execute.

After receiving the enhanced text 1024 from the natural language unit 903A, the group messaging service 104 sends the enhanced text 1028 to the selected bot 208 corresponding to the recorded message 1016. Bot 208 receives the enhanced text 1028 and in response, performs one or more designated actions 1040 corresponding to the decoded audio 1020 and enhanced text 1028. In some embodiments, bot 208 is associated with one or more commercial services 404, such as order management systems or systems involving various financial transactions. Bot 208 forwards one or more orders 1044 or other commercial service request to one or more commercial services 404 for execution. As previously described, commercial services 404 would need to be previously configured by the user of user node B 108B with payment, account number, IP address, or any other required information. Commercial services 404, after verifying the transaction with mobile device 112B, then carries out the requested order 1044. Bot 208 would then send a text reply 1028 to the group messaging service 104 with various information including at least completion of the request corresponding to the enhanced text 1028.

In response to receiving the text reply 1028 from the bot 208, the group messaging service 104 forwards a reply 1052 to group 1 120A including user node B 108B. Optionally, group messaging service 104 provides the original recorded message to the group 1056 in order to inform other user nodes 108 of group 1 120A of the request made by user node B 108B. At this point, all actions with recorded message 1016 have been carried out and the requested transaction has been completed.

A second embodiment where the bot 208 directly interfaces with voice libraries 1012 is now described. After the group messaging service 104 receives the recorded message with encoded audio (.PCU format) 1016, the group messaging service 104 forwards the .PCU audio 1032 to a .PCU to .WAV voice library 1008. The .PCU to .WAV voice library 1008 converts the audio in .PCU format 1032 to .WAV format 1036. The .PCU to .WAV voice library 1008 is also able to convert audio in .WAV format 1036 to .PCU format 1032. The .PCU to .WAV voice library 1008 may either be part of group messaging service 104 or remote from group messaging service 104. The .PCU to .WAV voice library 1008 sends the .WAV audio 1036 to the bot 208.

Bot 208 has an associated bot voice library 1012, including a speech-to-text engine 902B and a natural language unit 903B. Bot voice library 1012 converts .WAV audio 1036 into enhanced text. The enhanced text may be required by the bot 208 in order to perform designated actions 1040, or may be required by one or more commercial services 404 to perform additional actions including processing orders or financial transactions. In one embodiment, bot 208 performs designated actions 1040 after receiving the .WAV audio 1036 but before converting the .WAV audio 1036 into enhanced text with bot voice library 1012. In another embodiment, bot 208 performs designated actions 1040 after receiving the .WAV audio 1036 and after converting the .WAV audio 1036 into enhanced text with bot voice library 1012.

After bot 208 has completed all designated actions 1040, bot 208 sends an audio reply 1048, usually in compressed .MP3 format, to the .PCU to .WAV voice library 1008. The .PCU to .WAV voice library 1008 converts audio in .MP3 format 1048 into .PCU audio 1032, and sends the .PCU audio 1032 to the group messaging service 104. The group messaging service 104 receives the .PCU audio 1032 and a reply, and sends a reply 1052 to group 1 120A, including user node B 108B. Optionally, the group messaging service 104 sends the original message to the group 1056. At this point, all actions with recorded message 1016 have been carried out and the requested transaction has been completed.

Figure 11:
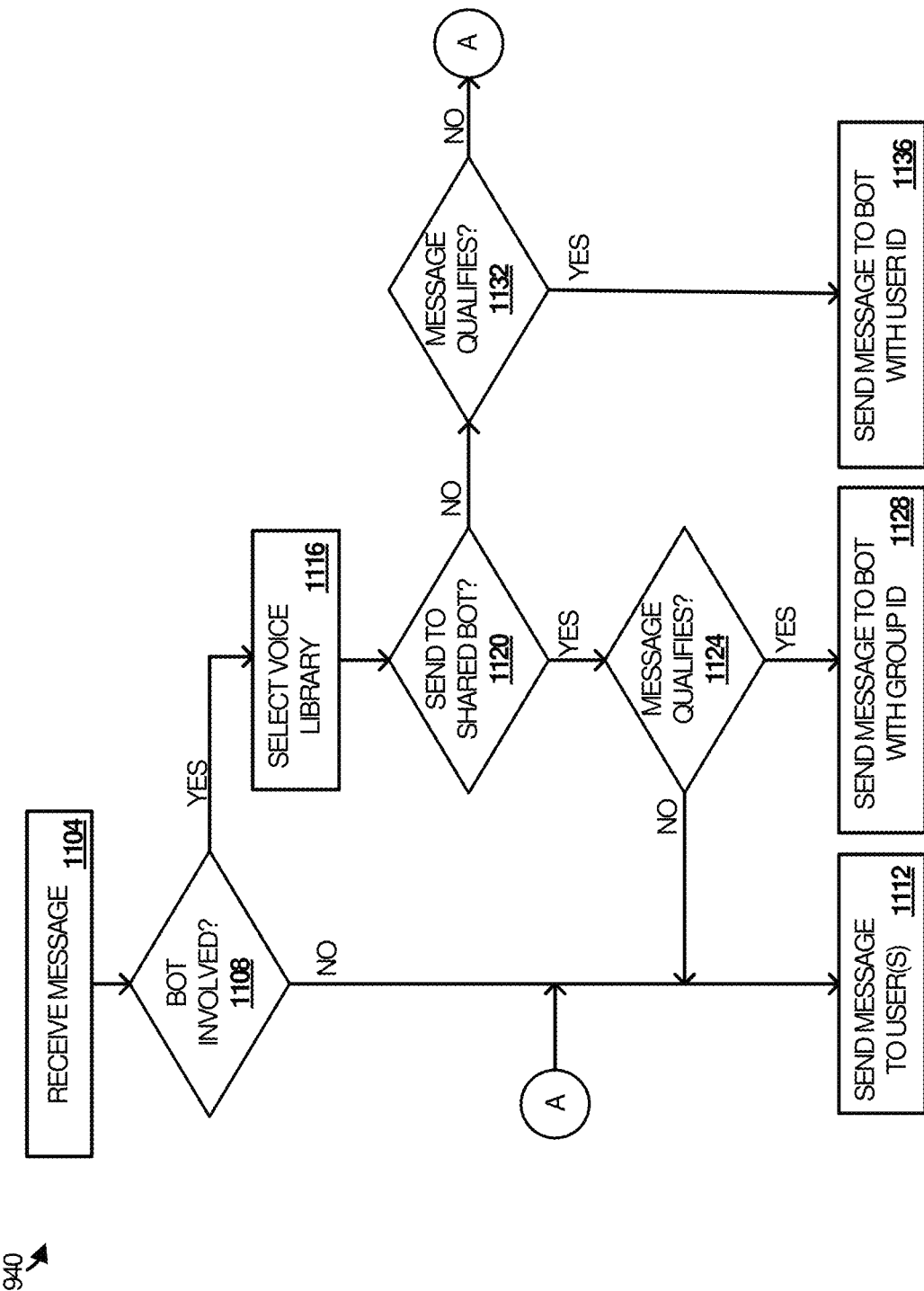
FIG. 11 illustrates a flowchart of a bot architecture message flow process using voice libraries in accordance with embodiments of the present disclosure.

FIG. 11 illustrates a flowchart of a bot architecture message flow process 940 using voice libraries in accordance with embodiments of the present disclosure. The bot messaging process 940 allows a user node 108 of a group 120 to send a message 124 to various configurations of bots 208 and voice libraries. Once a bot 208 is configured into a group 120, a user node 108 may send and receive messages to and from the bot 208 through the group messaging service 104. Flow begins at block 1104.

At block 1104, the group messaging service 104 receives a message 124 from a user node 108 in a group 120. The message 124 includes recorded audio, a destination group 120 identifier, a bot identifier (if the message 124 is intended to be sent to a bot 208), and an identifier of the user node 108 sending the message 124. Flow proceeds to decision block 1108.

At block 1108, the group messaging service 104 determines if there is a bot 208 configured in the group 120 corresponding to the destination group 120 identifier. If there is a bot 208 configured in the group 120 corresponding to the destination group 120 identifier, then flow proceeds to block 1116. If there is not a bot 208 configured in the group 120 corresponding to the destination group 120 identifier, then flow instead proceeds to block 1112.

At block 1112, the group messaging service 104 has determined that a bot 208 is not addressed in the message 124 (decision block 1108) or the message 124 is not qualified (decision blocks 1124 and 1132), and therefore sends the received message 124 to the user nodes 108 within the destination group 120. Addresses for the user nodes 108 within the destination group 120 are determined by reviewing the data structure 212 within the group messaging service 104 corresponding to the destination group 120. Flow ends at block 1112, or the group messaging service 104 returns to block 1104 to wait for a next received message 124.

At block 1116, the group messaging service 104 selects a voice library 1004, 1008, 1012 to apply to the message 124. If only a single voice library is available, the group messaging service 104 selects that voice library. In some embodiments, voice libraries 1012 may be specific to a bot 208. In other embodiments, voice libraries 1004 may be general-purpose and able to be used with many such bots 208. In yet other embodiments, voice libraries 1008 may be used to convert recorded audio from one format to another format. Flow proceeds to decision block 1120.

At decision block 1120, the group messaging service 104 determines if the received message 124 should be sent to a specific shared bot 208. The group messaging service 104 reviews the data structure 212 corresponding to the destination group 120, and attempts to identify a shared bot entry 504A corresponding to the bot identifier in the received message 124. A data structure 212 may include any number of shared or per-user bot entries 504A/504B. If there is a match, and a shared bot entry 504A in the data structure 212 matches the bot identifier, then flow proceeds to decision block 1124. If there is not a match, and no shared bot entries 504A in the data structure 212 match the bot identifier, then the received message should be sent to a per-user bot 208 and flow instead proceeds to decision block 1132.

At decision block 1124, the group messaging service 104 determines if the message 124 qualifies. A qualified message 124 is a message with content that conforms with a bot entry 504A/504B in the data structure 212. With respect to decision block 1124, since there is a bot 208 involved (decision block 1108) and the bot 208 is a shared bot 208 (decision block 1120), the message 124 must be sent by a user node 108 in the same data structure 212 as the shared bot 208. Therefore, a qualified user node 108 has transmitted the message 124 and is able to have the message 124 sent to the shared bot 208. If the message qualifies, then flow proceeds to block 1128. If the message does not qualify, then flow instead proceeds to block 1112.

At block 1128, the group messaging service 104 has identified a match between the received message 124 and the data structure 212 corresponding to the destination group 120, and sends the message 124 to the selected shared bot 208. At this point, the message 124 has been delivered to the addressed shared bot 208, and the addressed shared bot 208 carries out one or more functions corresponding to recorded audio within the message 124. In some embodiments, the shared bot 208 provides a data or audio acknowledgment back to the group messaging service 104, and in turn the group messaging service 104 provides the data or audio acknowledgment back to the user node 108 that sent the original message 124 or the group 120 that includes the user node 108 that sent the original message 124. In some embodiments, after the group messaging service 104 sends the message 124 to the selected shared bot 208, flow proceeds to block 1112 and the group messaging service 104 sends the message 124 to other users and user nodes 108 within the same group 120 as the user node 108 that sent the original message 124.

At decision block 1132, the group messaging service 104 determines if the message 124 qualifies. A qualified message 124 is a message with content that conforms with a bot entry 504A/504B in the data structure 212. With respect to decision block 1132, since there is a bot 208 involved (decision block 1108) and the bot 208 is a per-user bot 208 (decision block 1120), the message 124 must be sent by a user node 108 in the same data structure 212 as the per-user bot 208. Therefore, a qualified user node 108 has transmitted the message 124 and is able to have the message 124 sent to the per-user bot 208. If the message qualifies, then flow proceeds to block 1136. If the message does not qualify, then flow instead proceeds to block 1112.

At block 1136, the group messaging service 104 has identified a match between the received message 124 and the data structure 212 corresponding to the destination group 120, and sends the message 124 to the selected per-user bot 208. At this point, the message 124 has been delivered to the addressed per-user bot 208, and the addressed per-user bot 208 carries out one or more functions corresponding to recorded audio within the message 124. The per-user bot 208 provides a data or audio acknowledgment back to the group messaging service 104, and in turn the group messaging service 104 provides the data or audio acknowledgment back to the user node 108 that sent the original message 124. In some embodiments, after the group messaging service 104 sends the message 124 to the selected per-user bot 208, flow proceeds to block 1112 and the group messaging service 104 sends the message 124 to other users and user nodes 108 within the same group 120 as the user node 108 that sent the original message 124.

Figure 12:
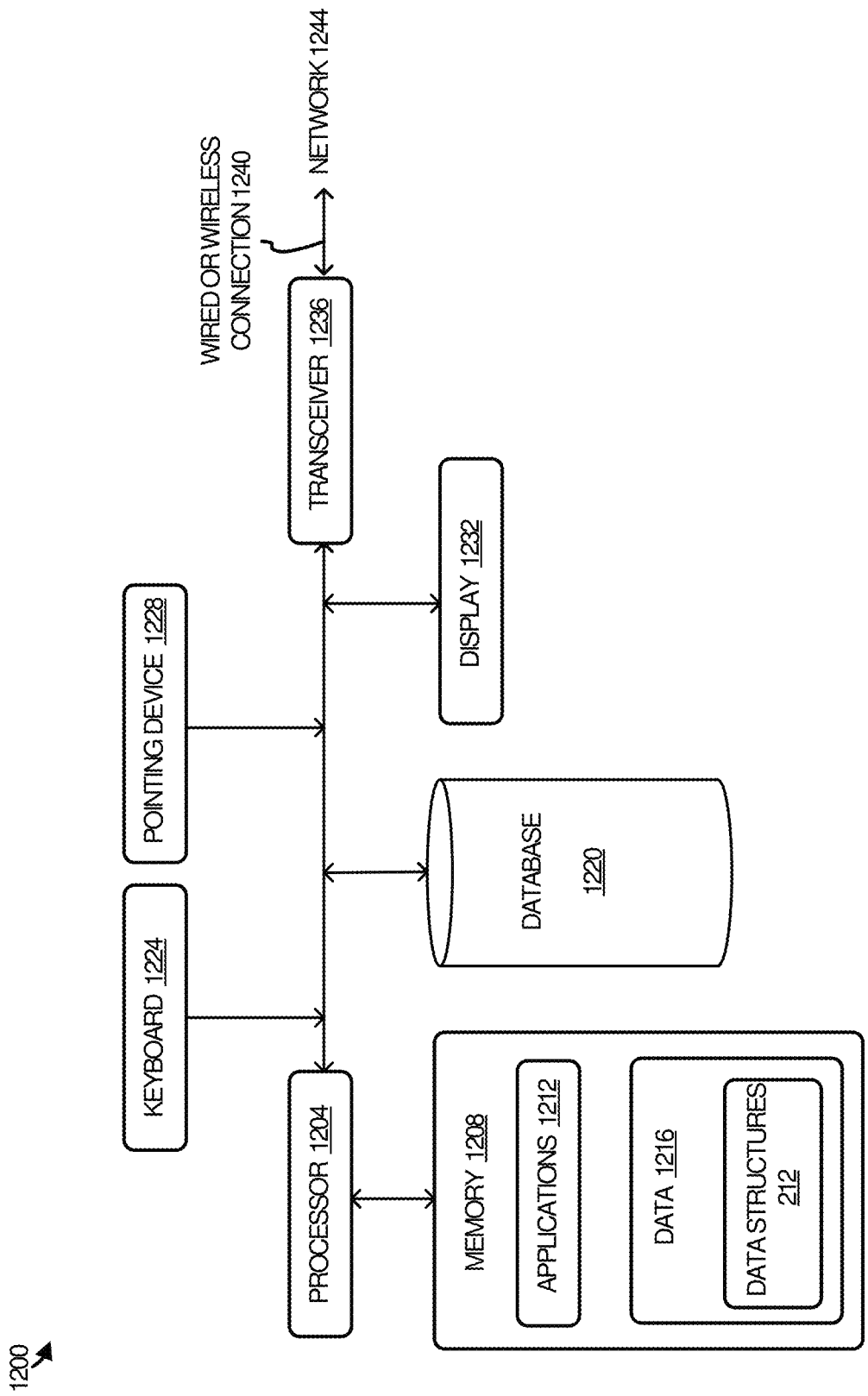
FIG. 12 illustrates a representative computing device in accordance with embodiments of the present disclosure.

FIG. 12 illustrates a representative computing device 1200 in accordance with embodiments of the present disclosure. Computing device 1200 performs the processes of the present application, including process 216 of FIG. 3, process 604 of FIG. 8, and process 940 of FIG. 11. Computing device 1200 may be any sort of known computing device including servers, desktop computers, notebook computers, tablets, embedded computers, personal digital assistants (PDAs), smart phones, wearable computers, or any other sort of computing device 1200.

Computing device 1200 includes memory 1208, which may include one or both of volatile and nonvolatile memory types. In some embodiments, the memory 1208 includes firmware which includes program instructions that are fetched and executed, including program instructions for the processes of the present invention. Memory 1208 also includes data 1216 which includes data structures 212 of the present application. Examples of non-volatile memory 1208 include, but are not limited to, flash memory, SD, Erasable Programmable Read Only Memory (EPROM), Electrically Erasable Programmable Read Only Memory (EEPROM), hard disks, and Non-Volatile Read-Only Memory (NOVRAM). Volatile memory 1208 stores various data structures and user data. Examples of volatile memory 1208 include, but are not limited to, Static Random Access Memory (SRAM), Dual Data Rate Random Access Memory (DDR RAM), Dual Data Rate 2 Random Access Memory (DDR2 RAM), Dual Data Rate 3 Random Access Memory (DDR3 RAM), Zero Capacitor Random Access Memory (Z-RAM), Twin-Transistor Random Access Memory (TTRAM), Asynchronous Random Access Memory (A-RAM), ETA Random Access Memory (ETA RAM), and other forms of temporary memory.

In addition to memory 1208, computing device 1200 may also include a database 1220, which may be local to computing device 1200 or externally accessible to computing device 1200 such as in a cloud environment providing cloud storage. Database 1220 may provide storage for a large number of parameters including data structures 212, recorded or decoded audio from messages 124, voice libraries, or any other applications or data associated with embodiments of the present application.

Computing device 1200 includes a processor 1204. Processor 1204 includes one or more processing devices suitable for executing device applications 1212 and data 1216 such as Intel x86-compatible processors, embedded processors, mobile processors, and/or RISC processors. Processor 1204 may include several devices including field-programmable gate arrays (FPGAs), memory controllers, North Bridge devices, and/or South Bridge devices. Although in most embodiments, processor 1204 fetches application 1212 program instructions and data 1216 from memory 1208, it should be understood that processor 1204 and applications 1212 may be configured in any allowable hardware/software configuration, including pure hardware configurations implemented in ASIC or FPGA forms.

Computing device 1200 also includes a display 1232. The display 1232 may include control and non-control areas. In most embodiments, controls are "soft controls" displayed on a screen and not necessarily hardware controls or buttons. In some embodiments one or more controls may be "soft controls" and one or more controls may be hardware controls or buttons. In yet other embodiments, controls may be all hardware controls or buttons. Display 1232 may be a touch screen whereby controls may be activated by a finger touch or touching with a stylus or pen. Non-control areas are areas of the screen not including a control.

Computing device 1200 includes a network transceiver 1236. Network transceiver 1236 is any wired or wireless interface able to connect to one or more networks, including the internet or cloud in order to transmit and receive messages 124, 612, 708, 904, 932, 1016, 1056 and replies 924, 928, 1052. Network transceiver 1236 may also be configured to transmit and receive decoded audio 908 and 1020, PCU audio 1032, text 912, and enhanced text 916, 1024, and 1028.

Computing device 1200 may also include a keyboard 1224 and pointing device 1228 to interact with applications 1212 and the display 1232.

The functional block diagrams, operational scenarios and sequences, and flow diagrams provided in the Figures are representative of exemplary systems, environments, and methodologies for performing novel aspects of the disclosure. While, for purposes of simplicity of explanation, methods included herein may be in the form of a functional diagram, operational scenario or sequence, or flow diagram, and may be described as a series of acts, it is to be understood and appreciated that the methods are not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all acts illustrated in a methodology may be required for a novel implementation.

The descriptions and figures included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the disclosure. Those skilled in the art will also appreciate that the features described above can be combined in various ways to form multiple implementations. As a result, the invention is not limited to the specific implementations described above, but only by the claims and their equivalents.

The invention claimed is:

1. A method comprising:
receiving, by a group messaging service configured to manage messaging between a plurality of user nodes in a group, a message comprising recorded audio and a bot identifier for a bot member of the group, a bot comprising a software application for performing a task over the internet;
in response to receiving the message, searching a data structure of the group, maintained by the group messaging service, based on the bot identifier to determine that the bot member is a member of the group;
in response to determining the bot member is a member of the group, accessing a bot entry in the data structure corresponding to the bot identifier, the bot entry including an indicator of a voice library corresponding to the bot member, voice libraries including a set of processing elements configured to convert an audio message into a target format;
selecting which of a plurality of available voice libraries to use to process the recorded audio based on the indicator in the bot entry;
processing, by a selected voice library, the recorded audio to produce a modified message in the target format suited to the bot member; and
sending, by the group messaging service, the modified message to the bot member.

2. The method of claim 1, further comprising:
determining a type of bot the bot member is between:
a group bot responsive to any member of the group; and
a user bot responsive to a selected user node from the group;
receiving, by the group messaging service, a reply from the bot member in response to sending the modified message; and
sending the reply to the selected user node when the bot member is a user bot, and to the plurality of user nodes when the bot member is a group bot.

3. The method of claim 1, wherein processing the recorded audio comprises:
converting, by a speech-to-text engine of the selected voice library, the recorded audio to text data; and
converting, by a natural language unit of the selected voice library, the text data to create enhanced text, wherein enhanced text comprises a command specially formatted for execution by the bot member.

4. The method of claim 3, wherein the message further includes a message address, wherein the group messaging service extracts the message address from the enhanced text.

5. The method of claim 1 further comprising:
sending the message, by the group messaging service, to the plurality of user nodes in response to receiving the message.

6. The method of claim 1, wherein selecting which of the plurality of voice libraries to use comprises:
selecting between:
a voice library including a preferred speech-to-text unit and a preferred natural language unit; and
a voice library including a .PCU to .WAV format converter.

7. The method of claim 1, wherein:
the group messaging service receives the recorded audio as encoded audio;
processing the recorded audio includes decoding the recorded audio to obtain decoded audio; and
processing the recorded audio includes processing the decoded audio.

8. The method of claim 1, wherein:
the group messaging service comprises a plurality of data structures for a plurality of groups, the plurality of data structures each comprising a unique group identifier;
searching the data structure of the group for the bot entry comprises:
selecting a data structure from the plurality of data structures matching a target group identifier from the message;
reviewing the selected data structure for bot entries comprising an identifier and a bot address; and
determining the selected data structure comprises at least the bot entry.

9. The method of claim 2, wherein determining the type of bot the bot member is further comprises:
reviewing the bot entry for the type of bot;
determining the bot entry corresponds to a user bot when the bot entry includes a user node identifier; and
determining the bot entry corresponds to a group bot when the bot entry includes a group identifier.

10. A memory device storing instructions that, when executed, cause a processor to perform a method comprising:
receiving, by a group messaging service configured to manage messaging between a plurality of user nodes in a group, a message comprising recorded audio and a bot identifier for a bot member of the group, a bot comprising a software application for performing a task over the internet;
in response to receiving the message, searching a data structure of the group, maintained by the group messaging service, based on the bot identifier to determine that the bot member is a member of the group;
in response to determining the bot member is a member of the group, accessing for a bot entry in the data structure corresponding to the bot identifier for an indicator of a voice library corresponding to the bot member, voice libraries including a set of processing elements configured to convert an audio message into a target format;
selecting which of a plurality of available voice libraries to use to process the recorded audio based on the indicator in the bot entry;
processing, by a selected voice library, the recorded audio to produce a modified message in the target format suited to the bot member; and
sending, by the group messaging service, the modified message to the bot member.

11. The memory device of claim 10, wherein the modified message commands the bot member to send an order to a commercial service for order fulfillment.

12. The memory device of claim 10, wherein processing the recorded audio comprises:
converting, by a speech-to-text engine of the selected voice library, the recorded audio to text data; and
converting, by a natural language unit of the selected voice library, the text data to create enhanced text, wherein enhanced text comprises a command specially formatted for execution by the bot member.

13. The memory device of claim 10, the processor performing the method further comprising:
determining a type of bot the bot member is between:
a group bot responsive to any member of the group; and
a user bot responsive to a selected user node from the group;

receiving, by the group messaging service, a reply from the bot member in response to sending the modified message; and sending the reply to the selected user node when the bot member is a user bot, and to the plurality of user nodes when the bot member is a group bot.

14. The memory device of claim 13, wherein:
the reply comprises received text; and
sending the reply includes converting the received text to audio data.

15. The memory device of claim 14, the processor performing the method further comprising:
processing, by the selected voice library, the received text to produce decoded reply audio:
encoding the decoded reply audio to produce encoded reply audio; and
sending the reply includes sending the encoded reply audio.

16. A computing system, comprising:
a storage system comprising program instructions; and
a processor, operably coupled to the storage system, which executes the program instructions to operate a group messaging service configured to manage messaging between a plurality of user nodes in a group, including:
receive a message comprising recorded audio and a bot identifier for a bot member of the group, a bot comprising a software application for performing a task over the internet;
in response to receiving the message, search a data structure of the group, maintained by the group messaging service, based on the bot identifier to determine that the bot member is a member of the group;
in response to determining the bot member is a member of the group, accessing for a bot entry in the data structure corresponding to the bot identifier, the bot entry including an indicator of a voice library corresponding to the bot member, voice libraries including a set of processing elements configured to convert an audio message into a target format;
select a selected voice library from a plurality of available voice libraries to use to process the recorded audio based on the indicator in the bot entry;

process, by the selected voice library, the encoded recorded audio to produce a modified message in the target format suited to the bot member; and
send, by the group messaging service, the modified message to the bot member.

17. The computing system of claim 16, wherein the processor operates the group messaging service, further including:
receive the message as encoded audio;
decode the encoded recorded audio to obtain decoded audio;
send a request to convert, by a speech-to-text engine of the selected voice library, the decoded audio to decoded text; and
send a request to enhance, by a natural language unit of the selected voice library, the decoded text to create enhanced text, wherein enhanced text comprises a command specially formatted for execution by the bot member.

18. The computing system of claim 16, wherein the processor operates the group messaging service, further including:
send the message to the plurality of user nodes in response to receiving the message.

19. The computing system of claim 16, wherein:
the group messaging service comprises a plurality of data structures for a plurality of groups, the plurality of data structures each comprising a unique group identifier;
searching the data structure of the group for the bot entry comprises:
select a data structure from the plurality of data structures matching a target group identifier from the message;
review the selected data structure for bot entries comprising an identifier and a bot address; and
determine the selected data structure comprises at least the bot entry.

20. The memory device of claim 10, wherein selecting which of the plurality of voice libraries to use comprises:
selecting between:
a voice library including a preferred speech-to-text unit and a preferred natural language unit; and
a voice library including a .PCU to .WAV format converter.

* * * * *

UNITED STATES PATENT AND TRADEMARK OFFICE
CERTIFICATE OF CORRECTION

PATENT NO. : 11,127,636 B2
APPLICATION NO. : 15/937035
DATED : September 21, 2021
INVENTOR(S) : Jesse Robbins et al.

Page 1 of 1

It is certified that error appears in the above-identified patent and that said Letters Patent is hereby corrected as shown below:

In the Claims

Claim 10, Line 15, delete "for"

Claim 16, Line 17, delete "for"

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*